United States Patent
Jung et al.

(10) Patent No.: US 7,022,601 B2
(45) Date of Patent: Apr. 4, 2006

(54) METHOD OF MANUFACTURING A SEMICONDUCTOR DEVICE

(75) Inventors: Byung Hyun Jung, Seoul (KR); Dae Heok Kwon, Daejeon-Metropolitan (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/728,948

(22) Filed: Dec. 8, 2003

(65) Prior Publication Data

US 2004/0115913 A1 Jun. 17, 2004

(30) Foreign Application Priority Data

Dec. 14, 2002 (KR) ............... 10-2002-0080011

(51) Int. Cl.
*H01L 21/4763* (2006.01)
*H01L 21/44* (2006.01)
*H01L 21/3205* (2006.01)

(52) U.S. Cl. ............ 438/627; 438/652; 438/586; 438/643; 438/683

(58) Field of Classification Search ........ 438/652, 438/586, 658, 653, 643, 683
See application file for complete search history.

(56) References Cited

U.S. PATENT DOCUMENTS

| 5,250,467 | A | 10/1993 | Somekh et al. |
| 5,310,695 | A | 5/1994 | Suzuki |
| 6,340,629 | B1 | 1/2002 | Yeo et al. |
| 6,429,086 | B1 | 8/2002 | Meikle et al. |
| 6,605,874 | B1 * | 8/2003 | Leu et al. ............ 257/758 |
| 2003/0219979 | A1 * | 11/2003 | Choi et al. ............ 438/685 |
| 2004/0087136 | A1 * | 5/2004 | Wu et al. ............ 438/629 |

* cited by examiner

*Primary Examiner*—Chuong Anh Luu
(74) *Attorney, Agent, or Firm*—Pillsbury Winthrop LLP

(57) ABSTRACT

A method of manufacturing a semiconductor device is disclosed wherein a WSiN layer is deposited in a contact hole as a barrier metal using an ALD process. A tungsten layer is deposited on the WSiN layer in the nucleation stage thereof. Then, using a CVD process, the contact hole is completely filled with a tungsten layer. The WSiN layer is continuously and uniformly deposited in the contact hole having high aspect ratio, and the tungsten layer in the nucleation stage can be continuously and uniformly deposited on the WSiN layer, thus completely filling the contact hole with a tungsten layer deposited by the CVD process.

14 Claims, 5 Drawing Sheets

METHOD OF MANUFACTURING A SEMICONDUCTOR DEVICE

CROSS-REFERENCE TO RELATED APPLICATIONS

This application relates to and claims priority to the Republic of Korea Patent Application no. 10-2002-0080011, filed on Dec. 14, 2002, the contents of which are incorporated herein by reference.

BACKGROUND OF THE INVENTION

1. Field of the Invention

The present invention relates to a method of manufacturing a semiconductor device and, more particularly, to a method of manufacturing a semiconductor device which prevents a metal layer having a high point of fusion from incompletely filling a contact hole.

2. Description of Related Art

Generally, with the high integration of semiconductor devices, the size of a source/drain and a line width of a gate electrode of a MOS transistor and a line width of metal layer are reduced. In particular, when the line width of the metal layer is reduced, a size of a contact hole is also reduced. The contact hole is either for contacting the gate electrode and the metal layer or for contacting the source/drain and the metal layer. Since contact resistances of the gate electrode and the metal layer are increased, the resistance of the metal layer is also increased. Consequently, the operation speed of the semiconductor device is reduced. However, there is great demand for a semiconductor device with enhanced speed together with high integration.

In one scheme for satisfying this demand, a metal layer of a high fusion, e.g. tungsten (W) layer has been used to reduce the contact resistance. To reduce contact resistance of the tungsten layer and the contact region, a barrier metal is formed between the tungsten layer and the contact region.

In the conventional semiconductor device, shown in FIG. 1, an insulating layer 11 is deposited on a semiconductor substrate 10, a contact hole 12 is formed on a contact region of the semiconductor substrate 10, a barrier metal 13 is deposited on the insulating layer 11 and in the contact hole 12, and a tungsten layer 15 is deposited on the barrier metal 13 to fill the contact hole 12.

In the prior art, a TiN or WN layer, is used as a barrier metal 13 and is deposited on the insulating layer 11 and in the contact hole 12 by a sputtering process. However, as the size of the contact hole 12 is reduced below 0.2 μm and the aspect ratio thereof is increased above 5, it is more difficult to continuously perform deposition of the barrier metal 13 on the entire surface in the contact hole 12. Accordingly, the barrier metal 13 is hardly deposited on the bottom face of the contact hole 12. In this state, since the tungsten layer 15 cannot completely fill the contact hole, a void 16 forms in the lower portion of the contact hole 12. Thus, a contact defect occurs in the contact hole 12, which can produce numerous defects. An electrical disconnect may be generated in the contact hole 12. The reliability of the metal layer due to an electro migration or a stress migration may also be reduced.

In order to solve this problem, various methods using WSiN layer as a barrier metal have been proposed, but the methods still have many problems.

BRIEF SUMMARY OF THE INVENTION

Accordingly, it is an aspect of the present invention to solve the above-mentioned problems occurring in the prior art. It is a further aspect of the present invention to provide a method of manufacturing a semiconductor device, which prevents the formation of a contact defect in a fine or small contact hole, which has a high aspect ratio.

Another aspect of the present invention is to provide a method of manufacturing a semiconductor device using, a barrier metal that is continuously and uniformly deposited on the whole surface of the fine contact hole so as to prevent a metal having a high point of fusion from incompletely filling the contact hole. The method of manufacturing a semiconductor device in accordance with embodiments of the present invention includes forming an insulating layer on a semiconductor substrate, and forming a contact hole on the insulating layers, depositing a barrier metal in the contact hole and on the insulating layer using an atomic layer deposition process, depositing a tungsten layer on the barrier metal using the atomic layer deposition process, and filling the contact hole with a tungsten layer.

The fine contact hole can be completely filled with the tungsten layer by forming a barrier metal uniformly inside the contact hole.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
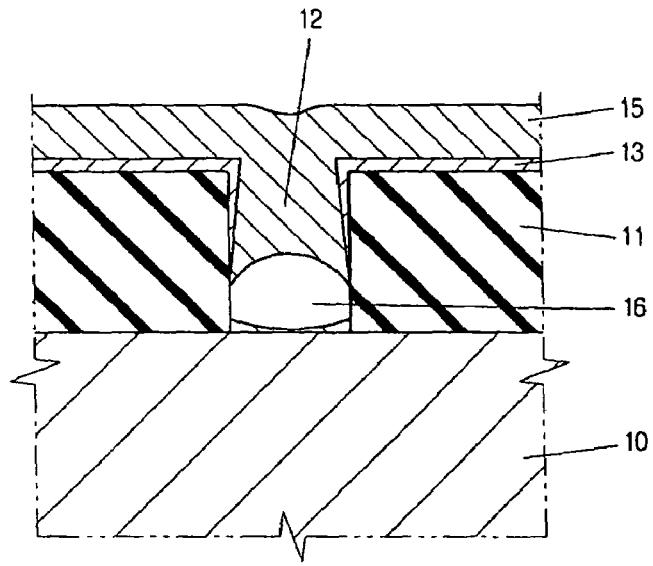
FIG. 1 illustrates an exemplary contact defect having a void is formed in a contact hole of a semiconductor device in the related art.
Figure 2:
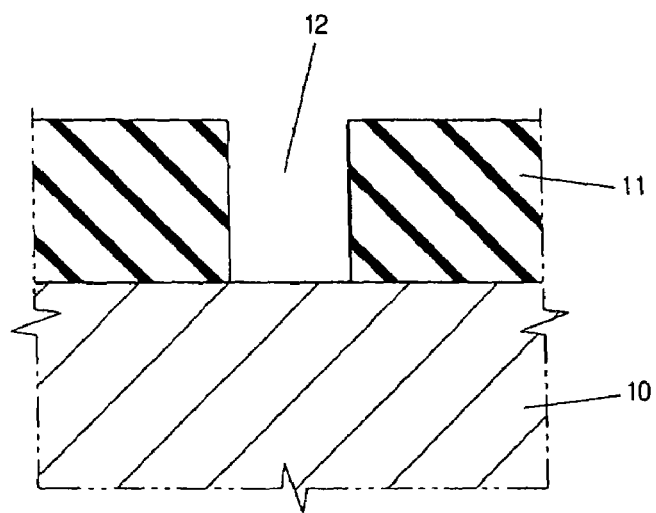
FIGS. 2 to 10 illustrate a method of manufacturing a semiconductor device in accordance with a preferred embodiment of the present invention.

Hereinafter, a preferred embodiment of the present invention will be described with reference to FIGS. 2–10, which illustrate a method of manufacturing a semiconductor device.

An insulating layer 11, such as an oxide layer, is formed on a semiconductor substrate 10 to a desired thickness. In order to define an active region of the substrate 10, a field oxide layer is formed on a field region of the semiconductor substrate 10, while a source/drain, a gate electrode, etc. of a transistor are formed on the active region of the substrate. Subsequently, to expose a contact part (not shown) of the semiconductor substrate 10 using a photolithography process, the insulating layer 11 on the contact part of the semiconductor substrate 10 is etched to form a contact hole 12. The contact hole 12 can have a high aspect ratio of, for example, above 5 and also can have a reduced size of below 0.2 μm.

Figure 6:
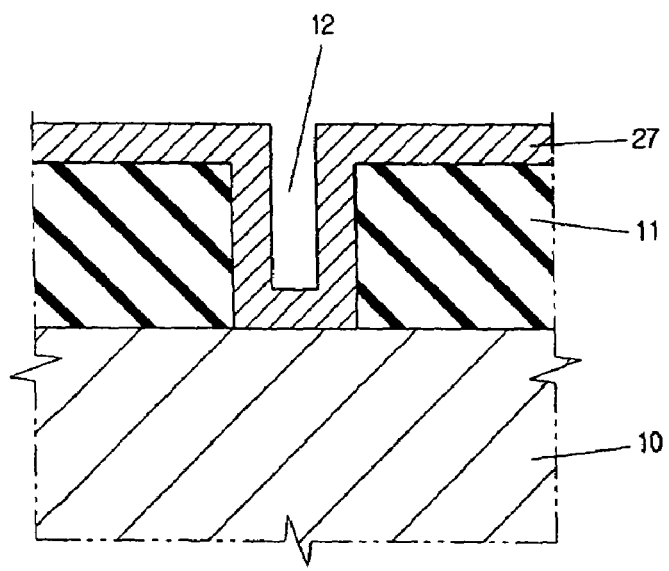

Referring to FIGS. 3 to 6, a barrier layer 27 is formed. The barrier layer 27 is preferably a WSiN layer 27. The layer 27 is formed by first locating the semiconductor substrate 10 in a single reaction chamber (not shown) for an atomic layer deposition ("ALD") process. As shown in FIG. 6, the barrier layer 27 is deposited using the ALD process on the insulating layer 11 and on the inner surface of the contact hole 12 of the semiconductor substrate 10. The barrier layer 27 can be a WSiN layer.

Figure 3:
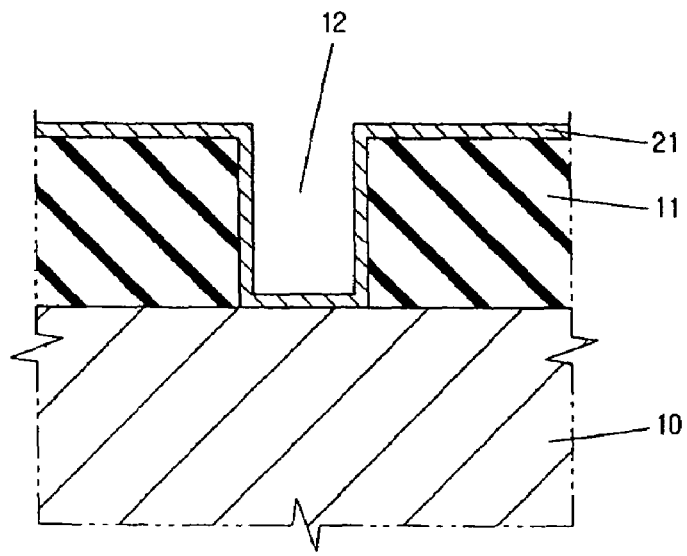

A reactive gas, SiH$_4$ gas, is injected into the reaction chamber through a gas inlet to deposit a Si single atomic layer 21 on the insulating layer 11 and the whole inner surface of the contact hole 12, as shown in FIG. 3. The SiH$_4$ gas is preferably injected at a flow rate of 50~100 Standard Cubic Centimeter per Minute (SCCM).

An inert gas is injected into the reaction chamber as a purging gas, to completely discharge any unreacted SiH$_4$ gas from the reaction chamber. The inert gas can be Ar or a mixture of Ar gas and H$_2$ gas.

Figure 4:
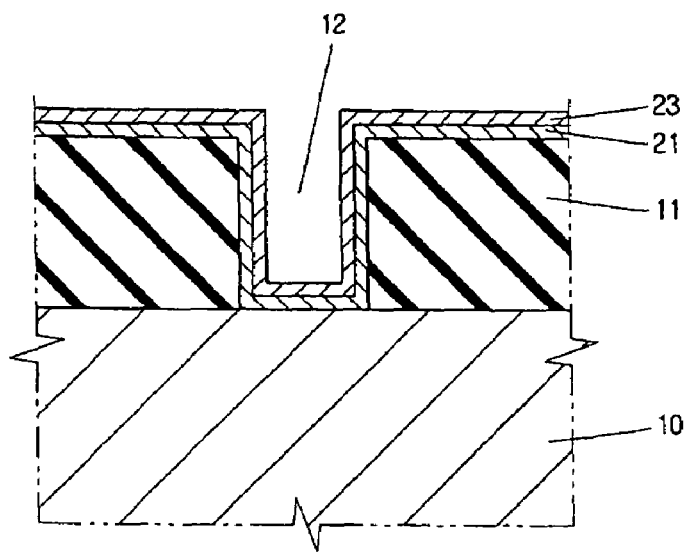
Figure 5:
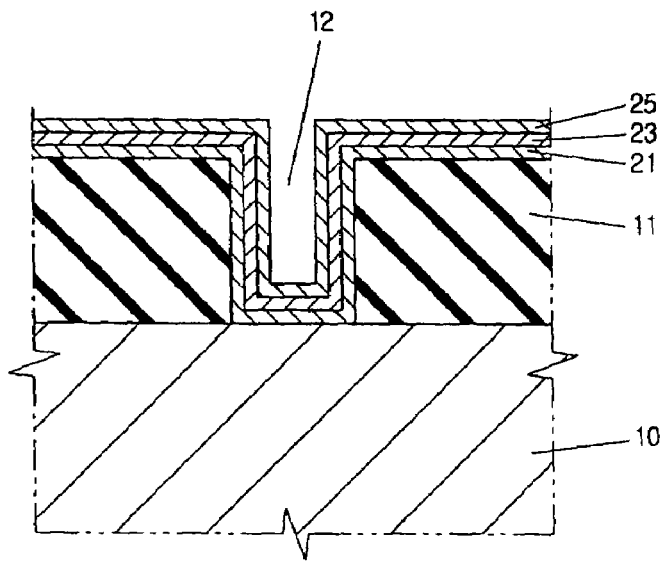

A reactive gas, WF$_6$ gas, is then injected into the reaction chamber through the gas inlet to deposit a tungsten (W) single atomic layer 23 on the Si single atomic layer 21, as shown in FIG. 4. The WF$_6$ gas is preferably injected at a flow rate of 10~50 SCCM. The SiH4 gas is injected before the injection of the WF$_6$ gas to prevent damage to the silicon surface of the contact hole 12 exposed to WF$_6$ gas. To prevent damage of the silicon surface of the contact hole 12 exposed to WF$_6$ gas, the SiH$_4$ gas and the WF$_6$ gas are preferably injected at a ratio of 1:5.

An inert gas is injected into the reaction chamber as a purging gas, to completely discharge any unreacted WF$_6$ gas from the reaction chamber. The inert gas can be Ar gas or a mixture of Ar gas and H$_2$ gas.

A reactive gas, NH$_3$ gas, is then injected into the reaction chamber through a gas inlet to deposit a nitrogen single atomic layer 25 on the tungsten (W) single atomic layer 23. The NH$_3$ gas is preferably injected at a flow rate of 30~80 SCCM. Then, an inert gas is injected into the reaction chamber as a purging gas to completely discharge any unreacted NH$_3$ gas from the reaction chamber. The inert gas can be Ar gas or a mixture of Ar gas and H$_2$ gas Accordingly, when one cycle of ALD process for successive deposition of the Si single atomic layer 21, the W single atomic layer 23 and the nitrogen single atomic layer has been performed, a single atomic WSiN layer 27 is formed through the reactions of the layers 21, 23 and 25. The WSiN layer 27 has a relatively thin thickness of 0.5~1.0 Å. To assist the reactions of the layers 21, 23 and 25 required to form the barrier layer 27, it is preferable to maintain a temperature in the reaction chamber between 200° C. and 600° C. during deposition of the layers 21, 23 and 25.

Figure 7:
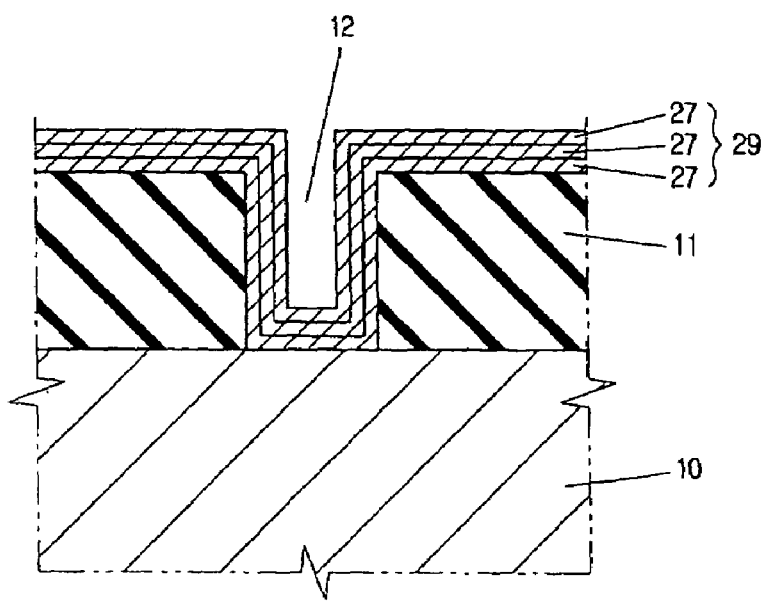

To form the WSiN layer 27 having a relatively thick thickness that is suitable as a barrier metal, the cycle of the ALD process is repeated to form a barrier layer 29. The ALD process can be repeated three or more times to form multiple WSiN layers 27, as shown in FIG. 7. The WSiN layer 29 can have a thickness of, preferably, 20 to 100 Å. Although the WSiN layer 29 has been illustrated to be composed of three WSiN layers 27, it is understood that the WSiN layer 29 can be composed of more than three WSiN layers 27.

Figure 8:
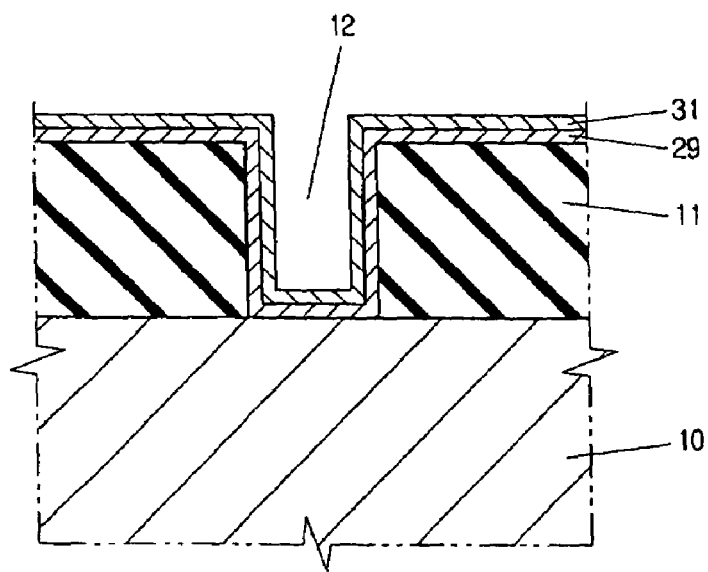

After the formation of WSiN layer 29, a tungsten (W) layer 31 is deposited on the WSiN layer 29 using the ALD process, as shown in FIG. 8. The tungsten layer 31 can be formed by locating the semiconductor substrate 10 in the same reaction chamber as used in the formation of the WSiN layer 29 or a separate reaction chamber. The tungsten layer 31 can be deposited using the ALD process.

The tungsten layer 31 is formed by first introducing reactive gas, SiH$_4$ gas into the reaction chamber through a gas inlet to deposit a Si single atomic layer (not shown) on the WSiN layer 29. The SiH$_4$ can be injected at a flow rate of 50~100 SCCM. Then, an inert gas is injected into the reaction chamber as a purging gas to completely discharge any unreacted SiH$_4$ gas from the reaction chamber. The inert gas can be Ar gas or a mixture of Ar gas and H$_2$ gas.

Then, the reactive gas, WF$_6$ gas, is injected at a flow rate of 10~50 SCCM into the reaction chamber through a gas inlet to form a tungsten (W) single atomic layer (not shown) on the Si single atomic layer.

An inert gas is injected into the reaction chamber as purging gas to completely discharge unreacted WF$_6$ gas from the reaction chamber. The inert gas can be Ar gas or a mixture of Ar gas and H$_2$ gas. Consequently, a tungsten (W) single atomic layer is deposited on the WSiN layer 29. It is preferable that the temperature of the reaction chamber is maintained at a certain temperature between 200° C. and 600° C. during one cycle of ALD process for depositing the tungsten single atomic layer. To form the tungsten layer having a desirable thickness, a cycle of the ALD process is repeated multiple times to form a thick tungsten layer 31. The tungsten layer 31 preferably has a thickness of 20 to 100 Å.

Using the deposition process for forming a single atomic layer, in an initial nucleation stage of the tungsten layer 31, the tungsten layer 31 can be continuously and uniformly deposited in the contact hole 12. This guarantees that the fine contact hole 12 is completely filled with a tungsten layer 33.

Figure 9:
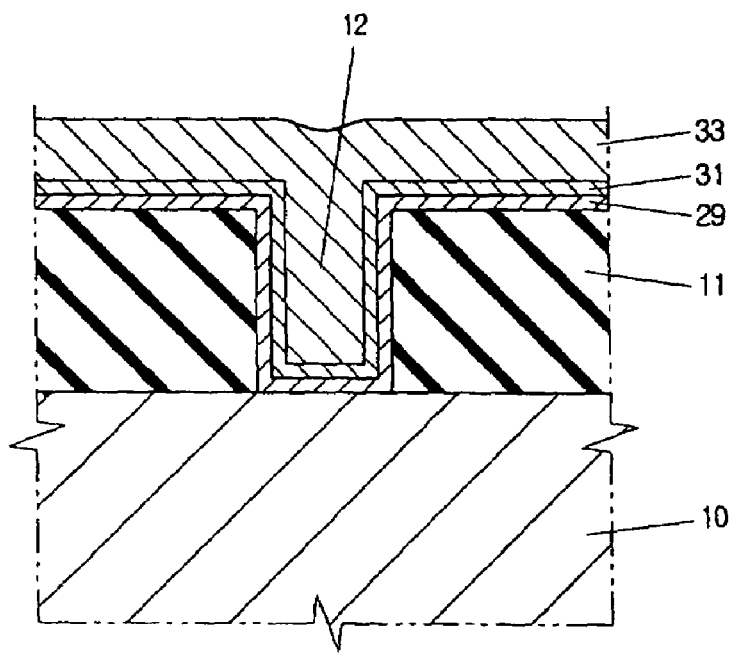

Using a chemical vapor deposition CVD process, the tungsten layer 33 is deposited on the tungsten layer 31 in a thickness sufficient to completely fill the contact hole 12, as shown in FIG. 9. The tungsten layer 33 is deposited at a speed considerably faster than that of the tungsten layer 31 which is formed by the single atomic layer deposition process.

Since the tungsten layer 31 of the contact hole 12 is continuously and uniformly deposited, the tungsten layer 33 can completely fill the contact hole 12. Although the contact hole 12 is small or fine having a high aspect ratio, the method of manufacturing the semiconductor device according to the present invention prevents the tungsten layer 33 from incompletely filling the contact hole 12. As a result, an electrical disconnection in the contact hole 12 and a degradation of reliability of the metal layer due to an electro migration or a stress migration are prevented.

Figure 10:
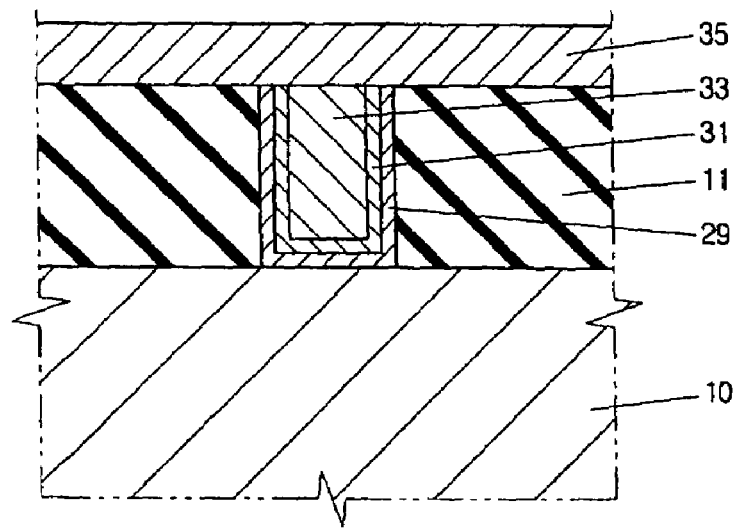

The tungsten layer 33 outside the contact hole 12, the tungsten layer 31 and the WSiN layer are then completely removed and the tungsten layer 33 in the contact hole 12 is planarized with the insulating layer 11. A metal layer 35 is then deposited on the insulating layer 11 and the tungsten layer 33, as shown in FIG. 10. The metal layer 35 can be an aluminum layer. Using photolithography, the metal layer 35 is processed to have a desired pattern.

As described above, the WSiN barrier metal layer 29 is deposited in the contact hole 12 using an ALD process, and the tungsten layer 31 is deposited on the WSiN layer 29 in the nucleation stage thereof. Then, using the CVD process, the contact hole 12 is filled with the tungsten layer 33.

Accordingly, the WSiN layer can be continuously and uniformly deposited in the fine contact hole 12, and a tungsten layer in the nucleation stage can be continuously and uniformly deposited on the WSiN layer, thus completely filling the contact hole with a tungsten layer 33 deposited by the CVD process.

The process described herein prevents the generation of voids in the contact hole 12, thus preventing an electrical disconnection in the contact hole 12 and a degradation of reliability of the metal layer 35 due to an electro migration or a stress migration.

Although preferred embodiments of the present invention have been described for illustrative purposes, those skilled in the art will appreciate that various modifications, additions and substitutions are possible, without departing from the scope and spirit of the invention as disclosed in the accompanying claims. Although the present invention has been described with reference to the contact hole for a convenience of explanation, the present invention may be adapted with reference to a via hole instead of the contact hole.

What is claimed is:

1. A method of manufacturing a semiconductor device, comprising:
    forming an insulating layer on a semiconductor substrate;
    forming a contact hole on the insulating layer;
    depositing a WSiN layer in the contact hole and on the insulating layer using an atomic layer deposition process, wherein a single atomic layer of the WSiN layer is deposited by a continuous cycle comprising:
        injecting $SiH_4$ gas,
        purging any remaining $SiH_4$ gas using an inert gas,
        injecting $WF_6$ gas,
        purging the remaining $WF_6$ gas using an inert gas,
        injecting $NH_3$ gas, and
        purging any remaining $NH_3$ gas using inert gas;
    depositing a tungsten layer on the barrier metal using the atomic layer deposition process; and
    filling the contact hole with a tungsten.

2. The method of claim 1, wherein the atomic layer deposition process for the WSiN layer and the tungsten layer is performed in a single reaction chamber.

3. The method of claim 1, wherein the tungsten is deposited by chemical vapor deposition.

4. The method of claim 1, wherein the WSiN layer has a thickness of 20 to 100 Å.

5. The method of claim 1, wherein the $SiH_4$ gas is injected at a flow rate of 50~100 SCCM.

6. The method of claim 1, wherein the $WF_6$ gas is injected at a flow rate of 10~100 SCCM.

7. The method of claim 1, wherein the $NH_3$ gas is injected at a flow rare of 30~80 SCCM.

8. The method of claim 5, wherein the $SiH_4$ gas and the $WF_6$ gas are injected in a ratio of 1:5.

9. The method of claim 6, wherein the $SiH_4$ gas and the $WF_6$ gas are injected in a ratio of 1:5.

10. The method of claim 2, wherein the tungsten layer is deposited at a temperature of 200 to 600° C.

11. The method of claim 1, wherein a single atomic layer of the tungsten layer is deposited by a continuous cycle comprising:
    injecting $SiH_4$ gas;
    purging any remaining $SiH_4$ gas using an inert gas;
    injecting $WF_6$ gas; and
    purging any remaining $WF_6$ gas using an inert gas.

12. The method of claim 11, wherein the tungsten layer is deposited to a thickness of 20 to 100 Å.

13. The method of claim 1, wherein the inert gas is any one of Ar gas and a mixture of Ar gas and $H_2$ gas.

14. The method of claim 11, wherein the inert gas is any one of Ar gas and a mixture of Ar gas and $H_2$ gas.

* * * * *